US 6,696,109 B2

(12) United States Patent
Akram

(10) Patent No.: US 6,696,109 B2
(45) Date of Patent: *Feb. 24, 2004

(54) CHEMICAL VAPOR DEPOSITION PROCESS FOR DEPOSITING TITANIUM SILICIDE FILMS FROM AN ORGANOMETALLIC COMPOUND

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/300,327

(22) Filed: Nov. 19, 2002

(65) Prior Publication Data

US 2003/0072892 A1 Apr. 17, 2003

Related U.S. Application Data

(63) Continuation of application No. 09/652,406, filed on Aug. 31, 2000, now Pat. No. 6,500,501, which is a continuation of application No. 09/148,371, filed on Sep. 4, 1998, now Pat. No. 6,168,837.

(51) Int. Cl.[7] ................................................ C23C 16/42
(52) U.S. Cl. .................. 427/576; 427/578; 427/255.28; 427/255.393
(58) Field of Search ................................ 427/576, 578, 427/255.28, 255.393; 438/681, 685

(56) References Cited

U.S. PATENT DOCUMENTS

| 4,782,380 A | 11/1988 | Shankar et al. |
| 5,030,589 A | 7/1991 | Noda |
| 5,139,825 A | 8/1992 | Gordon et al. |
| 5,246,881 A | 9/1993 | Sandhu et al. |
| 5,252,518 A | 10/1993 | Sandhu et al. |
| 5,254,499 A | 10/1993 | Sandhu et al. |
| 5,344,792 A | 9/1994 | Sandhu et al. |
| 5,352,488 A | 10/1994 | Spencer et al. |
| 5,661,115 A | 8/1997 | Sandhu |
| 5,760,474 A | 6/1998 | Schuele |
| 5,764,563 A | 6/1998 | Sur, Jr. et al. |
| 6,168,837 B1 * | 1/2001 | Akram ........................ 427/576 |
| 6,500,501 B1 * | 12/2002 | Akram ........................ 427/576 |

OTHER PUBLICATIONS

Pierson, Handbook of Chemical Vapor Deposition, Noyes Publications, Park Ridge, New Jersey, pp. 60–61 (no month), 1992.

Pierson, Thin Sold Films, vol. 45, pp. 257–263 (no month), 1977.

Bunshah et al., Deposition Technologies for Films and Coatings, Noyes Publications, Park Ridge, New Jersey, U.S.A., (1982), p. 366 (no month available).

Wolf, "Silicon Processing for the VLSI Era", vol. 1, Lattice Press, 1986.

* cited by examiner

Primary Examiner—Timothy Meeks
(74) Attorney, Agent, or Firm—TraskBritt

(57) ABSTRACT

A process for depositing titanium silicide films via chemical vapor deposition takes place in a deposition chamber that has been evacuated to less than atmospheric pressure and utilizes, as reactants, the organometallic compound tertiary-butyltris-dimethylamido-titanium and a silicon-containing compound such as silane.

7 Claims, 2 Drawing Sheets

CHEMICAL VAPOR DEPOSITION PROCESS FOR DEPOSITING TITANIUM SILICIDE FILMS FROM AN ORGANOMETALLIC COMPOUND

CROSS-REFERENCE TO RELATED APPLICATIONS

This application is a continuation of application Ser. No. 09/652,406, filed Aug. 31, 2000, now U.S. Pat. No. 6,500,501, issued Dec. 31, 2002, which is a continuation of application Ser. No. 09/148,371, filed Sep. 4, 1998, now U.S. Pat. No. 6,168,837, issued Jan. 2, 2001. This application is related to application Ser. No. 09/148,373, titled CHEMICAL VAPOR DEPOSITION PROCESS FOR DEPOSITING TITANIUM NITRIDE FILMS FROM AN ORGANO-METALLIC COMPOUND, which was filed on Sep. 4, 1998, now U.S. Pat. No. 6,338,880, issued Jan. 15, 2002.

BACKGROUND OF THE INVENTION

1. Field of the Invention

This invention relates to integrated circuit fabrication technology and, more specifically, to processes for forming titanium silicide films via chemical vapor deposition.

2. State of the Art

The compound titanium silicide ($TiSi_2$) is used extensively in the manufacture of integrated circuits. It is frequently used to reduce the sheet resistance of conductively-doped silicon conductors. It is also used to provide solid electrical contact between conductive plugs and an underlying conductively-doped silicon layer.

In a common application for integrated circuit manufacture, a contact opening is etched through an insulative layer down to a conductive region (which may have been formed by diffusion or a combination of implanting and diffusion) to which electrical contact is to be made. Titanium metal is deposited on the surface of the diffusion region and subsequently converted to titanium silicide, thus providing an excellent conductive interface at the surface of the diffusion region. A titanium nitride barrier layer is then deposited, coating the walls and floor of the contact opening. Chemical vapor deposition of tungsten metal or polycrystalline silicon (polysilicon) follows. Deposition of titanium metal and the subsequent conversion of the titanium metal can be replaced by the direct deposition via chemical vapor deposition of titanium silicide. The deposition step is followed by an elevated temperature anneal step which causes titanium silicide molecules to migrate into the underlying silicon layer, thus providing reliable electrical interface between the two layers.

At least three processes have been proposed for creating thin titanium silicide films: (1) reactive sputtering; (2) annealing, in an inert ambiance, a titanium layer that has been sputter-deposited on top of a silicon layer; and (3) chemical vapor deposition, using titanium tetrachloride and a silicon-containing compound, such as silane or dichlorosilane, as reactants.

Both reactive sputtering and annealing of deposited titanium result in films having poor step coverage, which are of limited use in submicron manufacturing processes. Chemical vapor deposition processes have an important advantage in that a conformal layer of any thickness may be deposited. This is especially advantageous in ultra-large-scale-integration circuits, where minimum feature widths may be smaller than 0.3 $\mu$m. Layers as thin as 10 Å may be readily produced using CVD. However, $TiSi_2$ coatings prepared using titanium tetrachloride have greater resistivity and are poor barriers to atomic migration than sputtered or annealed titanium silicide layers.

What is needed is a new chemical vapor deposition process which will provide highly conformal titanium silicide films of high purity, with step coverage that is suitable for sub-0.25 $\mu$m generations of integrated circuits, and resistivity values and barrier qualities that more closely approach those of sputtered and annealed titanium silicide films.

BRIEF SUMMARY OF THE INVENTION

This invention includes various processes for depositing titanium silicide ($TiSi_2$) films containing less than five percent carbon impurities and less than five percent oxygen impurities by weight via chemical vapor deposition and the use of an organometallic precursor compound. Sheet resistance of the deposited films is within a range of about 2 to 10 ohms per square. The deposition process takes place in a deposition chamber that has been evacuated to less than atmospheric pressure and utilizes the organometallic compound tertiary-butyltris-dimethylamido-titanium (TBTDMAT) and a silicon-containing compound as reactants. The compound tertiary-butyltris-dimethylamido-titanium has the formula $TiC(CH_3)_3(NR_2)_3$. FIG. 1 depicts the structural formula of tertiary-butyltris-dimethylamido-titanium. The deposition temperature, which is dependent on the silicon source, is within a range of about 400° C. to 800° C. The deposition reaction may be performed within approximately the lower half of the temperature range if a plasma enhanced chemical vapor deposition process is employed. If thermal decomposition is relied on to initiate a reaction between the organometallic compound and the silicon-containing compound, the reaction must be carried out in approximately the upper half of the temperature range. As a general rule, the more stable the reactants, the higher the decomposition temperature.

Titanium silicide films incorporating various other compounds may be deposited using either of the heretofore described embodiments of the process by adding other precursors to the TBTDMAT and the silicon-containing compounds. For example, by adding nitrogen-containing compounds such as amines, ammonia, and hydrazines to the silicon and titanium precursors and using the same reaction parameters, a film having the general composition $TiSi_xN_{(1-x)}$ can be deposited. Additionally, by adding tungsten-containing organometallic compounds such as bis(2,4-dimethylpentadienyl)titanium or tungsten halide compounds such as $WF_6$ or $WCl_6$ to the silicon and titanium precursors, a titanium silicide film having the general formula TiSiW can be deposited.

DETAILED DESCRIPTION OF THE INVENTION

Figure 1:
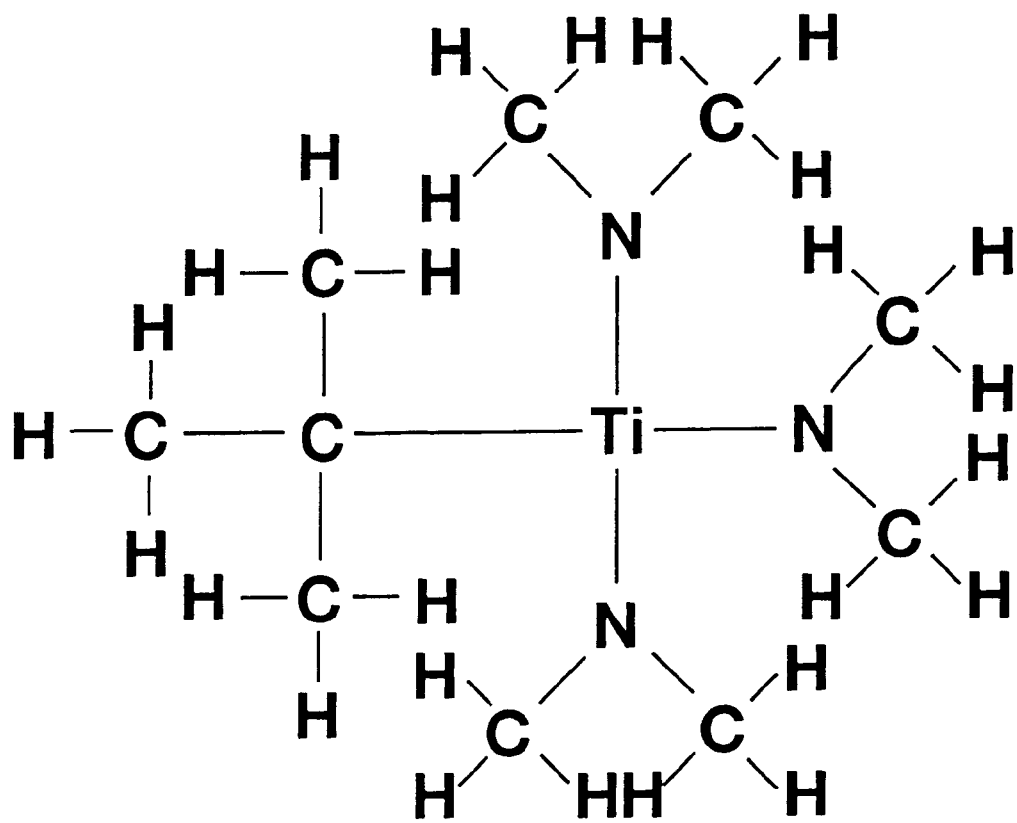
FIG. 1 is a structural diagram of tertiary-butyltris-dimethylamido-titanium.

Several embodiments of a new low-pressure chemical vapor deposition process for depositing highly conformal titanium silicide (TiSi$_2$) films having carbon impurities of less than five percent by weight and oxygen impurities of less than five percent by weight and resistivity of approximately 2 ohms per square will be described in reference to the cold-wall, plasma-enhanced, low-pressure chemical vapor deposition reactor system depicted in FIG. 2. Although the following description of the process represents what the inventor believes is the preferred embodiment of the process, the process may be practiced in either cold-wall or hot-wall plasma-enhanced chemical vapor deposition chambers, with or without premixing of the reactants. Furthermore, although the invention is directed to a technique for depositing conformal titanium silicide layers for use in the manufacture of integrated circuits, the process is also applicable to the deposition of titanium silicide on substrates other than semiconductor wafers.

A first major embodiment of the process will be described with reference to FIG. 2 A tertiary-butyltris-dimethylamido-titanium organometallic source gas is produced by heating liquid tertiary-butyltris-dimethylamido-titanium (the organometallic precursor compound). The gas phase organometallic compound, transported by a carrier gas, is admitted into a premixing chamber 3 through control valve 1 and a silicon-containing gas such as silane, chlorinated or fluorinated silanes, organometallic silicon compounds (or some combination thereof) is admitted into the premixing chamber 3 along with a carrier gas through control valve 2. The carrier gases employed may be H$_2$, N$_2$, He or Ar. Following the premixing of the gas phase reactants in premixing chamber 3, the premixed gases are admitted to the deposition chamber 4. Optionally, the organometallic compound may be mixed with an inert carrier gas by bubbling the carrier gas through the heated organometallic compound to further enhance the complete gasification of that reactant. As a further option, the liquid organometallic compound may be converted to a fine spray or mist by a liquid injector (not shown). The mist is then passed through a vaporizer chamber (also not shown) en route to the deposition chamber. Within the deposition chamber 4, a semiconductor wafer 5 is heated to a temperature within a range of about 400° C. to 600° C. by convection from substrate holder 6 (such as a graphite or alumina boat) that, in turn, is heated via halogen lamps 7. The walls of the chamber are maintained at a temperature which is sufficiently high to prevent condensation of TBTDMAT molecules thereon, yet not so high that decomposition of TBTDMAT molecules will occur. In a cold-wall reactor, the wafer is maintained at a temperature that is considerably higher than that of the chamber walls, thereby minimizing deposition of titanium nitride on the chamber walls. As a general rule, the chamber walls should be maintained within a range of about 50 to 400° C., and optimally within a range of about 100 to 200° C.

Figure 2:
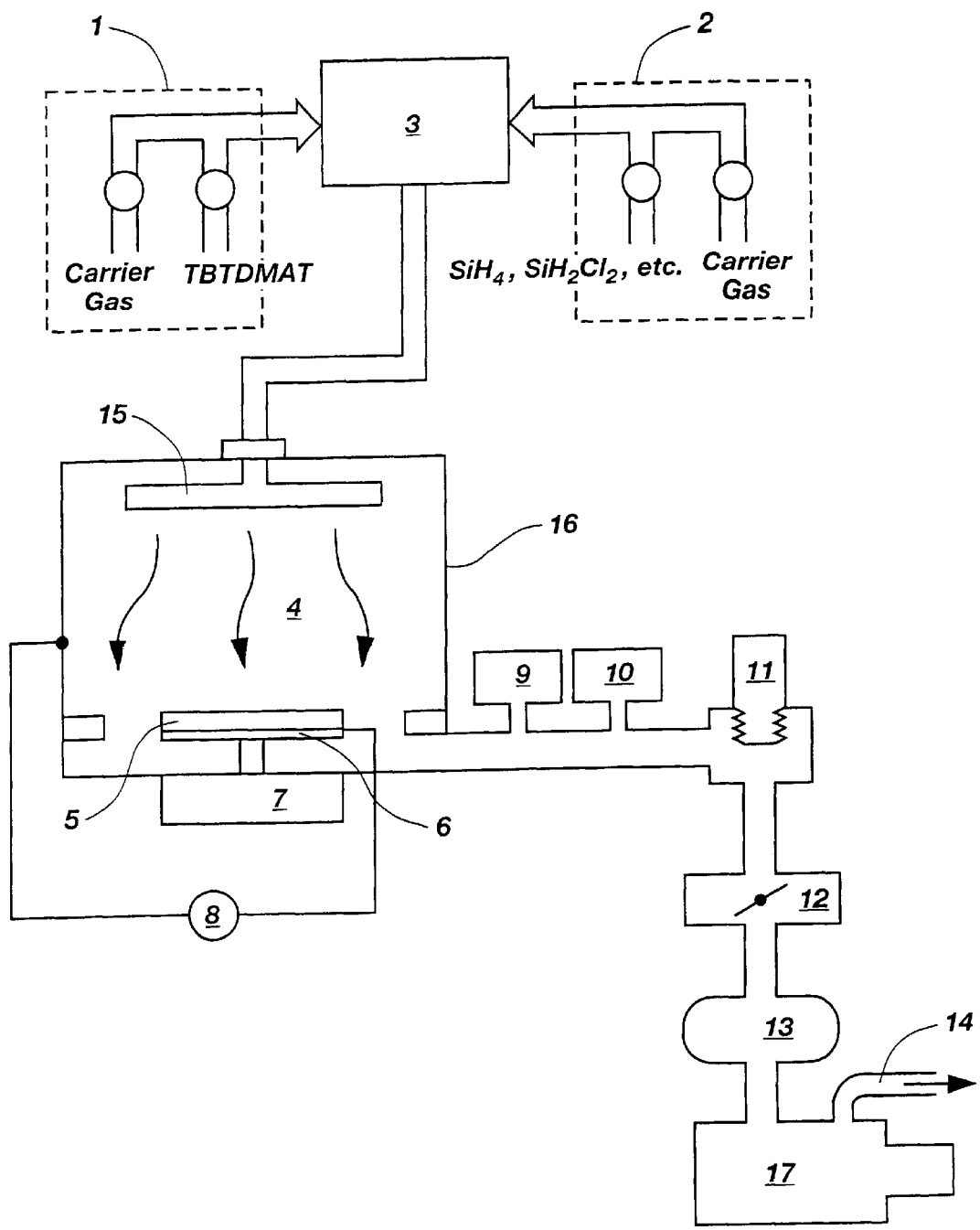
FIG. 2 is a block schematic diagram of a low-pressure chemical vapor deposition reactor system showing the precursor gases to be TBTDMAT and a silicon-containing compound.

Still referring to FIG. 2, the premixed combination of the vaporized organometallic compound, one or more carrier gases and the gas-phase silicon-containing compound enter deposition chamber 4 through shower head 15. A radio-frequency (RF) voltage, supplied by radio-frequency generator 8, is applied between substrate holder 6 and reaction chamber wall 16, thus forming a plasma in which some of the organometallic molecules and some of the silicon-containing molecules are converted to radicals, ions and metastables. An RF power density of about 1–2 watts/cm$^2$ is applied to the wafer in order to generate the plasma. Organometallic compound molecules are adsorbed on the surface of the semiconductor wafer 5, and silicon-containing radicals react with the adsorbed organometallic molecules to form a uniformly thick titanium silicide layer on the surface of the wafer.

As an alternative to the procedure employed above for the first embodiment of the process, a remote source PECVD reactor may be employed with similar results. In such a case, only the silicon-containing compound need be passed through the plasma generator; the organometallic compound may bypass the plasma generator en route to the deposition chamber 4.

Although the desired reaction may be effected at a pressure within a range of about 1 to 100 torr, a preferred range is deemed to be about 2 to 10 torr. A constant deposition pressure within that preferred range is monitored and maintained by conventional pressure control components consisting of pressure sensor 9, pressure switch 10, air operating vacuum valve 11 and pressure control valve 12. The byproducts of the reaction and the carrier gases (if carrier gases are used) pass through particulate filter 13 and escape through exhaust vent 14 with the aid of a blower 17 to complete the process.

The resistivity of the TiSi$_2$ films may be further reduced using anneal steps after the deposition of the films in accordance with the procedures heretofore disclosed. For example, a typical rapid thermal anneal can be performed at about 780° C. in a nitrogen ambiance for about 20 seconds. Lower anneal temperatures will, of course, require longer exposure periods.

A second major embodiment of the process will also be described with reference to the diagrammatic representation of the cold-wall plasma enhanced chemical vapor deposition (PECVD) reaction chamber of FIG. 2. However, for this embodiment, the reactor is not operated in the plasma-enhanced mode. Thus, no RF power is applied between the substrate holder 6 and the reaction chamber wall 16. Instead, increased wafer temperature is relied on to effect a reaction between the tertiary-butyltris-dimethylamido-titanium and the silicon-containing compound. Except for the use of higher temperatures within a range of about 600° C. to 800° C. and the lack of a plasma-generating RF power, other features of the process remain the same.

Other materials may be simultaneously incorporated in the titanium silicide films during either embodiment of the deposition process as heretofore described. For example, a titanium silicide film incorporating nitrogen and having the general formula TiSi$_x$Ni$_{(1-x)}$ may be deposited by introducing nitrogen-containing compounds such as amines, ammonia and hydrazines along with the TBTDMAT and silicon-containing compounds. Additionally, a titanium silicide film incorporating tungsten and having the general formula TiSiW may be deposited by introducing organometallic compounds such as bis(2,4-dimethylpentadienyl)tungsten or tungsten halide compounds such as WF$_6$ or WCl$_6$ along with the TBTDMAT and silicon-containing compounds. The nitrogen-containing compounds or tungsten-containing compounds may be introduced in a manner similar to that of the other reactants using the temperature guidelines heretofore provided for each embodiment of the invention.

While several embodiments of the process for depositing titanium silicide using tertiary-butyltris-dimethylamido-titanium and a silicon-containing compound as reactants have been disclosed herein, it will be obvious to those having ordinary skill in the art that modifications and changes may be made thereto without affecting the scope and spirit of the invention as claimed.

What is claimed is:

1. A titanium silicide film deposition process comprising:
   placing a substrate within a plasma-enhanced chemical vapor deposition chamber, the chamber including one of a remote source plasma generator for generating a plasma for flowing into the deposition chamber and an RF power source for generating a plasma within the chamber;

admitting vapor-phase tertiary-butyltris-dimethylamido-titanium into the chamber;

admitting a vapor phase silicon-containing compound into the chamber, the silicon-containing compound comprising at least one compound of a silane compound, chlorinated silane compounds, fluorinated silane compounds and organometallic silicon compounds;

heating the substrate to a temperature in the range of about 400° to 600° C.;

generating a plasma converting a portion of the silicon-containing compound into reactive species; and depositing a predominantly titanium silicide film on the substrate, the predominantly titanium silicide film containing less than 5 percent carbon impurities by weight, containing less than 10 percent oxygen impurities by weight, and having a nonannealed sheet resistance of approximately 2 ohms per square.

2. The process of claim 1, wherein the chamber includes a remote source plasma generator for generating the plasma that converts a portion of the silicon-containing compound into the reactive species with only a portion of the portion of the silicon-containing compound comprising a portion of the plasma.

3. The process of claim 1, wherein the chamber includes a remote source plasma generator for the generating the plasma that converts a portion of the silicon-containing compound into the reactive species with both the portion of the silicon-containing compound and a portion of the tertiary-butyltris-dimethylamido-titanium comprising a portion of the plasma.

4. The process of claim 1, further comprising:

admitting a nitrogen-containing compound into the chamber in combination with the tertiary-butyltris-dimethylamido-titanium and the silicon-containing compound, the nitrogen-containing compound being selected from the group consisting of amines, ammonia, and hydrazines for incorporating at least some nitrogen in the deposited predominantly titanium silicide film.

5. The process of claim 1, further comprising:

admitting a tungsten-containing compound into the chamber in combination with the tertiary-butyltris-dimethylamido-titanium and the silicon-containing compound, the tungsten-containing compound being selected from the group consisting of organo-tungsten compounds and tungsten halide compounds for incorporating at least some tungsten in the deposited predominantly titanium silicide film.

6. The process of claim 1, wherein the plasma comprises a plasma generated by the RF power source having a power density in the range of 1 to 2 watts/cm$^2$ applied in the chamber.

7. The process of claim 1, further comprising:

annealing the predominantly titanium silicide film subsequent to the deposition of the predominantly titanium silicide film.

* * * * *